US011921175B2

(12) United States Patent
Ohishi et al.

(10) Patent No.: US 11,921,175 B2
(45) Date of Patent: Mar. 5, 2024

(54) ARRAYED STRUCTURE AND MAGNETIC RESONANCE IMAGING APPARATUS

(71) Applicant: Canon Medical Systems Corporation, Otawara (JP)

(72) Inventors: Takafumi Ohishi, Yokohama (JP); Sadanori Tomiha, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 17/658,467

(22) Filed: Apr. 8, 2022

(65) Prior Publication Data

US 2022/0349967 A1 Nov. 3, 2022

(30) Foreign Application Priority Data

Apr. 28, 2021 (JP) ................................. 2021-076424
Apr. 6, 2022 (JP) ................................. 2022-063602

(51) Int. Cl.
*G01R 33/36* (2006.01)
*G01R 33/385* (2006.01)

(52) U.S. Cl.
CPC ....... *G01R 33/3692* (2013.01); *G01R 33/385* (2013.01)

(58) Field of Classification Search
CPC .......................... G01R 33/3692; G01R 33/385
See application file for complete search history.

(56) References Cited

U.S. PATENT DOCUMENTS 8,106,850 B1 1/2012 Gregoire et al.
2011/0133978 A1* 6/2011 Sim ...................... H01Q 17/007
427/102

FOREIGN PATENT DOCUMENTS

CN 105406156 A * 3/2016
JP 1-242052 A 9/1989
JP 2009-183472 A 8/2009

OTHER PUBLICATIONS

Machine Translation of CN-105406156-A1 (Year: 2016).*
Extended European Search Report dated Sep. 23, 2022 in European Patent Application No. 22167967.3, 8 pages.
Issa, "The Use of Metasurfaces for Magnetic Resonance Imaging Applications", Dissertation, University of Sheffield, Department of Electronic and Electrical Engineering, Jun. 2018, pp. 1-188 (211 total pages), XP055627434, Retrieved from the Internet:URL:http://etheses.whiterose.ac.uk/20823/1/Final%20thesis_version.pdf.

* cited by examiner

*Primary Examiner* — G. M. A Hyder
(74) *Attorney, Agent, or Firm* — Oblon, McClelland, Maier & Neustadt, L.L.P.

(57) ABSTRACT

According to one embodiment, an arrayed structure includes a cylindrical-shaped conductor layer and a cylindrical-shaped layer stack. The cylindrical-shaped layer stack is arranged on an inner periphery of the conductor layer and a plurality of frequency selective surfaces are arranged in layers and stacked. Each of the frequency selective surfaces has a plurality of elements which are periodically arranged. Each element of the plurality of elements is formed in such a manner that at least a portion of an edge of a first element that faces an adjacent element in the same layer is closer to a center of the first element than another portion of edge.

18 Claims, 14 Drawing Sheets

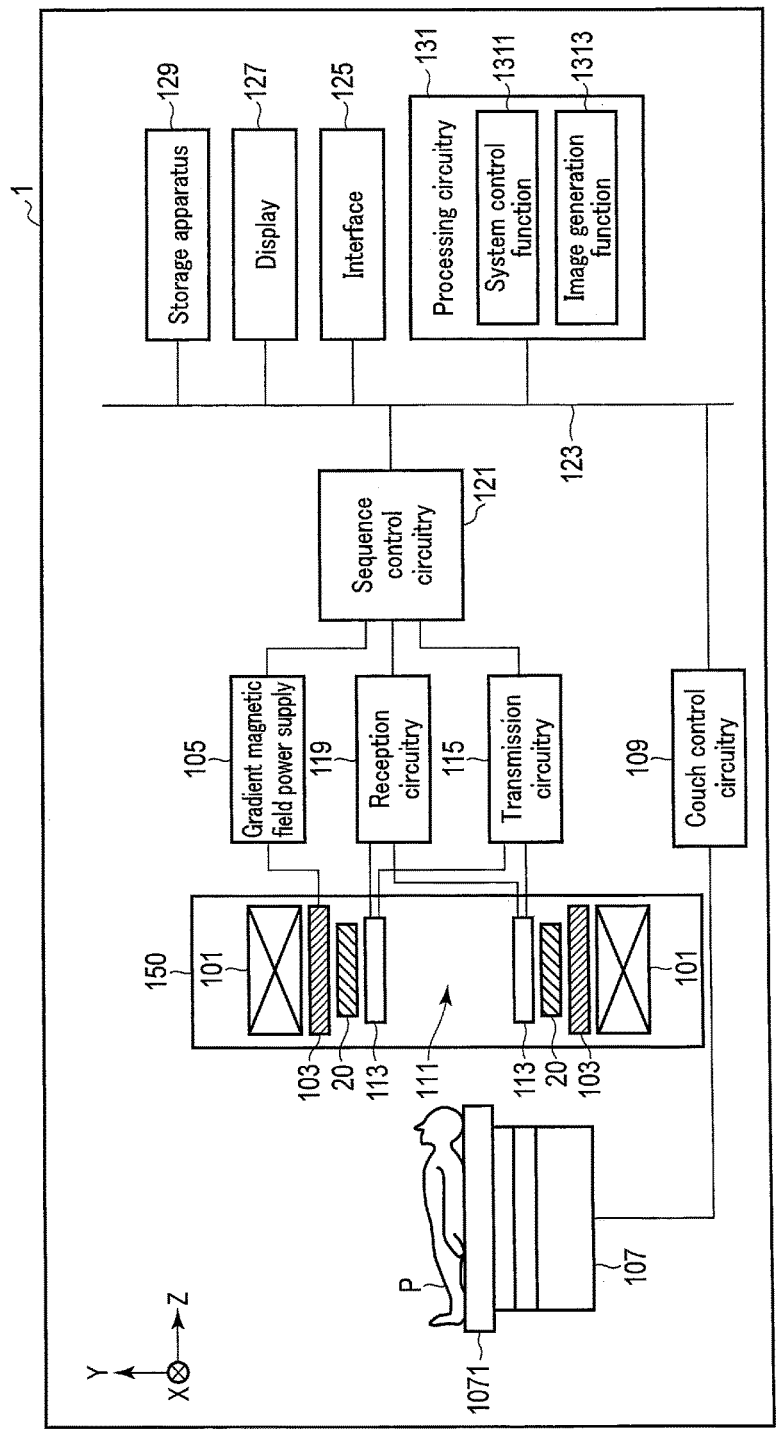
F I G. 1

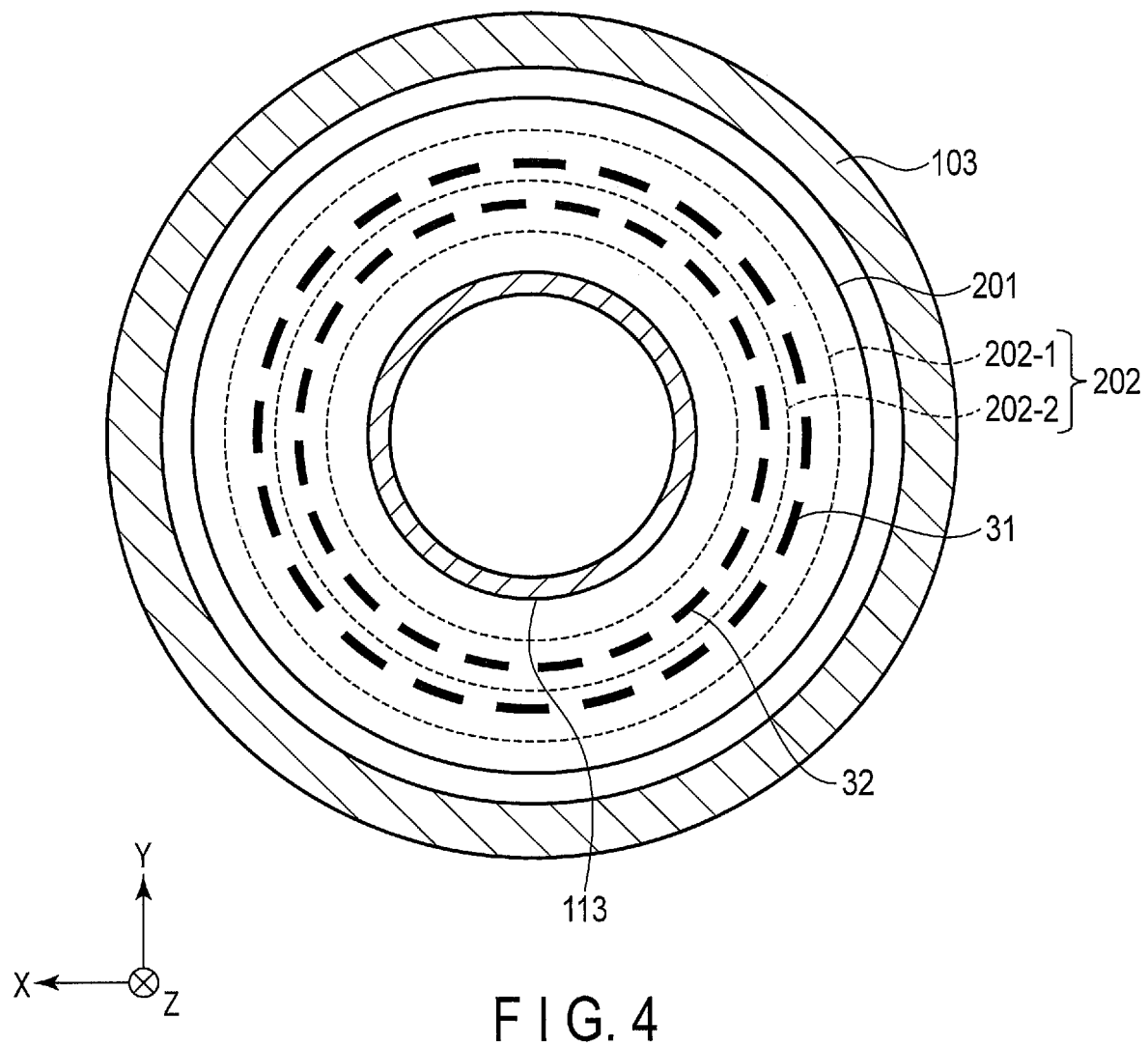
F I G. 4

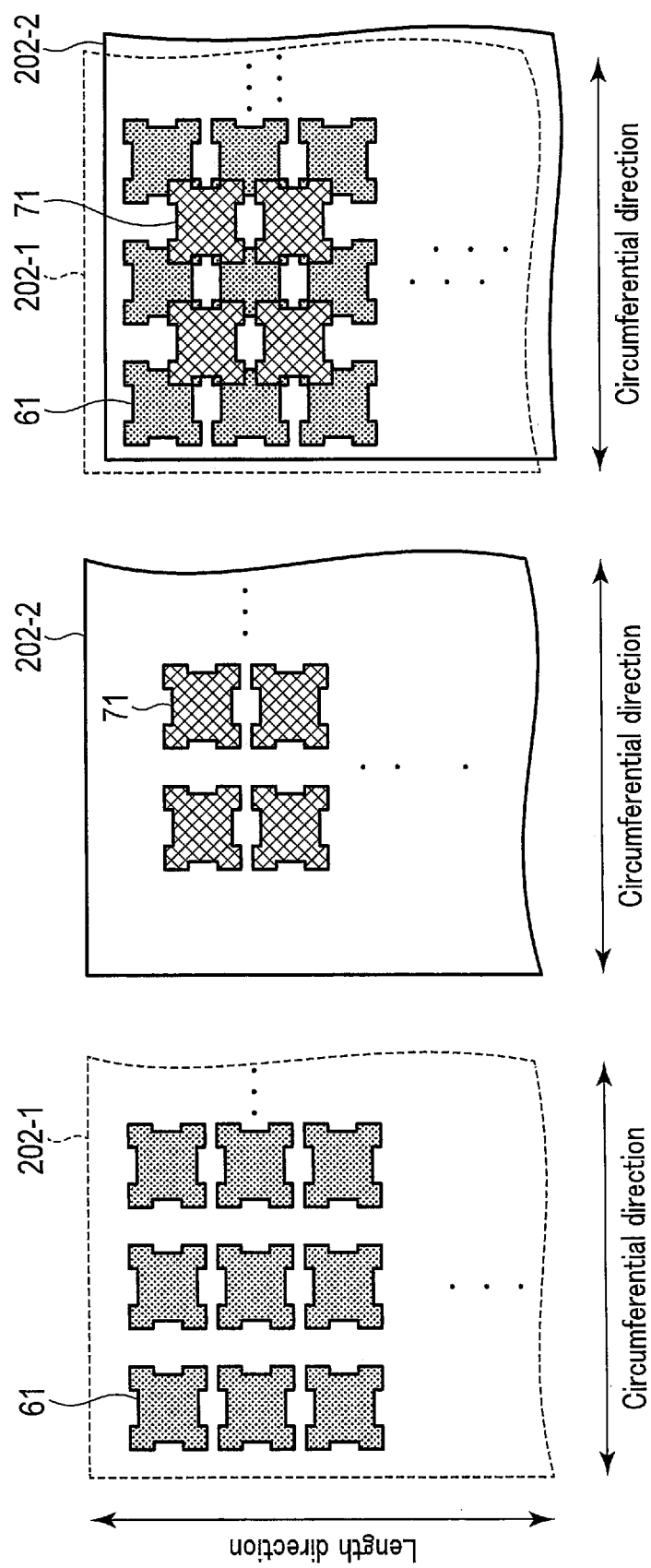
F I G. 7

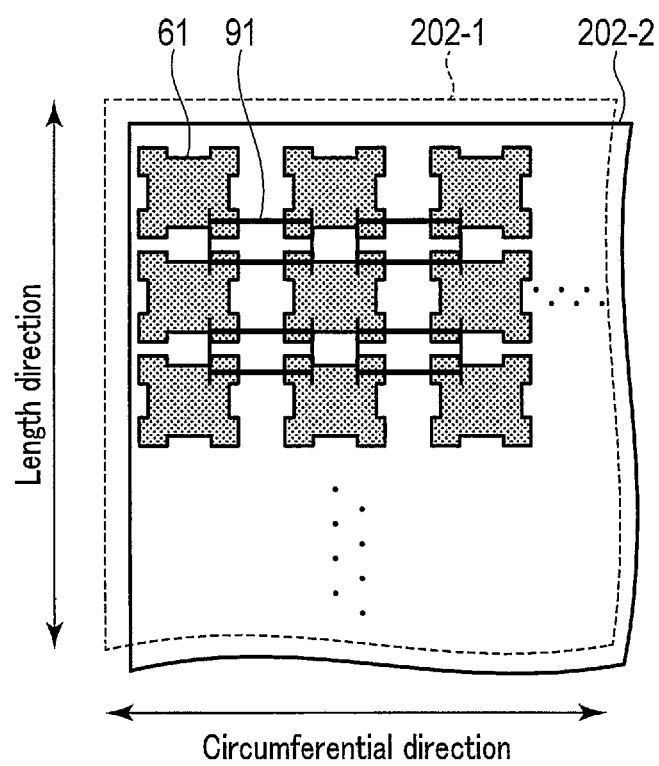
F I G. 10

ARRAYED STRUCTURE AND MAGNETIC RESONANCE IMAGING APPARATUS

CROSS-REFERENCE TO RELATED APPLICATIONS

This application is based upon and claims the benefit of priority from Japanese Patent Application No. 2021-076424, filed Apr. 28, 2021; and No. 2022-063602 filed Apr. 6, 2022; the entire contents of which are incorporated herein by reference.

FIELD

Embodiments described herein relate generally to an arrayed structure and a magnetic resonance imaging apparatus.

BACKGROUND

In an existing magnetic resonance imaging apparatus, when a magnetic resonance (MR) signal from a subject is received by a whole body coil, which is a transmitter/receiver coil, the reception gain becomes insufficient. One of the reasons why the gain becomes insufficient is that, since a signal reflected from an RF shield arranged in an outer periphery of the whole body coil is phase-inverted, such a signal and the MR signal from the subject directly received by the receiver coil cancel each other out, causing a decrease in the gain.

Thus, a receiver coil needs to be mounted on the subject; however, setting up a receiver coil by arranging it on the subject and connecting the receiver coil to the magnetic resonance imaging apparatus with the cable assembled on the coil is troublesome to the technician and is inefficient from the viewpoint of workflow. In addition, since a patient would feel discomfort with a receiver coil mounted on himself, it is ideal that the receiver coil not be used.

BRIEF DESCRIPTION OF THE DRAWINGS

FIG. 1 is a conceptual view showing an MRI apparatus including an arrayed structure according to an embodiment.

FIG. 4 is a cross-sectional view taken along an x-axis of the gantry of the MRI apparatus according to the embodiment.

FIG. 7 is a diagram showing a layer stack having the first example element shape.

FIG. 10 is a diagram showing an example of a layer stack in a shape obtained by combining the first and second example element shapes according to the embodiment.

DETAILED DESCRIPTION

Figure 2:
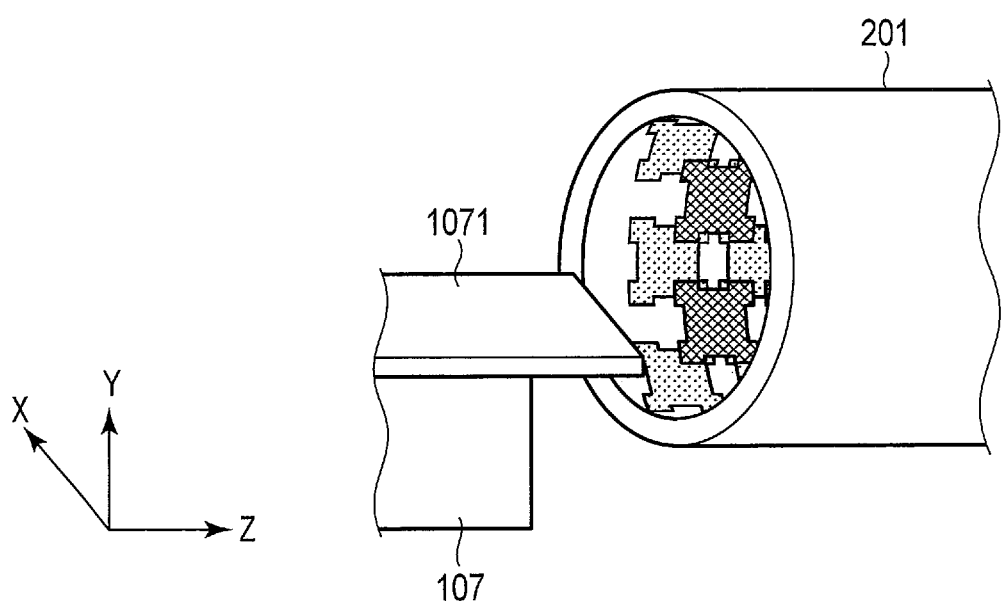
FIG. 2 is a perspective view showing details of the arrayed structure according to the embodiment.

In general, according to one embodiment, an arrayed structure includes a cylindrical-shaped conductor layer and a cylindrical-shaped layer stack. The cylindrical-shaped layer stack is arranged on an inner periphery of the conductor layer and a plurality of frequency selective surfaces are arranged in layers and stacked. Each of the frequency selective surfaces has a plurality of elements which are periodically arranged. Each element of the plurality of elements is formed in such a manner that at least a portion of an edge of a first element that faces an adjacent element in the same layer is closer to a center of the first element than another portion of edge.

Hereinafter, an arrayed structure and a magnetic resonance imaging (MRI) apparatus according to an embodiment will be described with reference to the accompanying drawings. In the embodiments described below, elements assigned the same reference symbols are assumed to perform the same operations, and redundant descriptions thereof will be omitted as appropriate.

FIG. 1 is a conceptual view showing an MRI apparatus including an arrayed structure according to an embodiment.

As shown in FIG. 1, an MRI apparatus 1 includes an arrayed structure 20, a static magnetic field magnet 101, a gradient magnetic field coil 103, a gradient magnetic field power supply 105, a couch 107, couch control circuitry 109, a transmitter/receiver coil 113, transmission circuitry 115, reception circuitry 119, sequence control circuitry 121, a bus 123, an interface 125, a display 127, a storage apparatus 129, and processing circuitry 131. The processing circuitry 131 includes a system control function 1311 and an image generation function 1313. The static magnetic field magnet 101, the gradient magnetic field coil, the arrayed structure 20, and the transmitter/receiver coil 113 are arranged in a gantry 150. The MRI apparatus 1 may include a hollow, cylindrical-shaped shim coil provided between the static magnetic field magnet 101 and the gradient magnetic field coil 103.

The static magnetic field magnet 101 is a magnet formed in a hollow, approximately cylindrical shape. The static magnetic field magnet 101 is not necessarily in an approximately cylindrical shape, and may be formed in an open shape. The static magnetic field magnet 101 generates a uniform static magnetic field in the inner space. In the present embodiment, it is assumed that the static magnetic field magnet 101 is a superconducting magnet that uses a superconducting coil.

The gradient magnetic field coil 103 is a coil formed in a hollow, cylindrical shape. The gradient magnetic field coil 103 is arranged inside the static magnetic field magnet 101. The gradient magnetic field coil 103 is formed of a combination of three coils respectively corresponding to X, Y, and Z axes that are orthogonal to each other. The Z-axis direction is defined as the same as the orientation of the static magnetic field. The Y-axis direction is a vertical direction, and the X-axis direction is a direction perpendicular to both the Z and Y axes. The three coils of the gradient magnetic field coil 103 individually receive an electric current from the gradient magnetic field power supply 105 and respectively generate gradient magnetic fields in which the magnetic field intensity changes along each of the X, Y and Z axes.

The gradient magnetic fields along each of the X, Y, and Z axes generated by the gradient magnetic field coil 103 respectively form, for example, a gradient magnetic field for frequency encoding (readout gradient field), a gradient magnetic field for phase encoding, a gradient magnetic field for phase encoding, and a gradient magnetic field for slice selection. The gradient magnetic field for frequency encoding is employed to change the frequency of an MR signal emitted from a subject P in accordance with the spatial position. The gradient magnetic field for phase encoding is employed to change the phase of an MR signal in accordance with the spatial position. The gradient magnetic field for slice selection is employed to determine an imaging slice.

The gradient magnetic field power supply 105 is a power supply apparatus that supplies an electric current to the gradient magnetic field coil 103 under the control of the sequence control circuitry 121.

The couch 107 is an apparatus that includes a couch top 1071 on which a subject P is placed. The couch 107 inserts the couch top 1071 on which the subject P is placed into a bore 111, under the control of the couch control circuitry 109. The couch 107 is, for example, mounted in an examination room where the MRI apparatus 1 is mounted, in such a manner that the longitudinal axis of the couch 107 is parallel to the central axis of the static magnetic field magnet 101.

The couch control circuitry 109 is circuitry that controls the couch 107, and drives the couch 107 in response to an operator's instructions via the interface 125, thereby moving the couch top 1071 in a longitudinal direction and a vertical direction.

The transmitter/receiver coil 113 is an RF coil arranged inside the gradient magnetic field coil 103, and is, for example, a whole body coil. The transmitter/receiver coil 113 generates a transmit RF wave corresponding to a radio frequency magnetic field in response to a Radio Frequency (RF) pulse supplied from the transmission circuitry 115. The transmitter/receiver coil 113 receives an MR signal emitted from the subject P through the radio frequency magnetic field, and outputs the received MR signal to the reception circuitry 119.

The arrayed structure 20 is arranged between the transmitter/receiver coil 113 and the gradient magnetic field coil 103 to improve the reception gain of the MR signal. The arrayed structure 20 will be discussed later with reference to FIG. 2 and the drawings that follow.

The transmission circuitry 115 supplies an RF pulse corresponding to a Larmor frequency, etc. to the transmitter/receiver coil 113 under the control of the sequence control circuitry 121.

The reception circuitry 119 generates, under the control of the sequence control circuitry 121, a digital MR signal, which is digitized complex data, based on the MR signal output from the transmitter/receiver coil 113. Specifically, the reception circuitry 119 subjects the MR signal to a variety of signal processing, and then performs analog-to-digital (A/D) conversion on data that has been subjected to the variety of signal processing. The reception circuitry 119 samples the A/D-converted data. Thereby, the reception circuitry 119 generates a digital MR signal (hereinafter referred to as "MR data"). The reception circuitry 119 outputs the generated MR data to the sequence control circuitry 121.

The sequence control circuitry 121 controls the gradient magnetic field power supply 105, the transmission circuitry 115, the reception circuitry 119, etc. in accordance with an examination protocol output from the processing circuitry 131, and performs imaging on the subject P. An examination protocol includes various pulse sequences (also referred to as "imaging sequences") corresponding to the examination. The examination protocol defines the magnitude of a current supplied from the gradient magnetic field power supply 105 to the gradient magnetic field coil 103, the timing of a supply of a current from the gradient magnetic field power supply 105 to the gradient magnetic field coil 103, the magnitude of an RF pulse supplied from the transmission circuitry 115 to the transmitter/receiver coil 113, the timing of a supply of an RF pulse from the transmission circuitry 115 to the transmitter/receiver coil 113, and the timing of reception of an MR signal at the transmitter/receiver coil 113, etc.

The bus 123 is a transmission path for transmitting data between the interface 125, the display 127, the storage apparatus 129, and the processing circuitry 131. The bus 123 may be connected via, for example, a network to a variety of physiological signal measuring equipment, an external storage apparatus, and various modalities. For example, an electrocardiograph (unillustrated) is connected to the bus as physiological signal measuring equipment.

The interface 125 includes circuitry that receives various instructions and information inputs from an operator. The interface 125 includes, for example, circuitry relating to a pointing device such as a mouse or an input device such as a keyboard. The circuit included in the interface 125 is not limited to a circuit relating to a physical operational component, such as a mouse or a keyboard. For example, the interface 125 may include an electrical signal processing circuit which receives an electrical signal corresponding to an input operation from external input equipment provided separately from the MRI apparatus 1 and outputs the received electrical signal to various circuits.

The display 127 displays, for example, various magnetic resonance (MR) images generated by an image generation function 1313, and various types of information relating to imaging and image processing, under the control of a system control function 1311 in the processing circuitry 131. The display 127 is, for example, a CRT display, a liquid crystal display, an organic EL display, an LED display, a plasma display, or any other display or monitor known in the present technical field.

The storage apparatus 129 stores, for example, MR data filled in k-space through the image generation function 1313 in the processing circuitry 131, and image data generated through the image generation function 1313. The storage apparatus 129 stores various types of examination protocols, conditions for imaging etc., including a plurality of imaging parameters that define examination protocols. The storage apparatus 129 stores programs corresponding to various functions executed by the processing circuitry 131. The storage apparatus 129 is, for example, a semiconductor memory element, such as a random access memory (RAM) and a flash memory, a hard disk drive, a solid-state drive, or an optical disk, etc. The storage apparatus 129 may also be, for example, a drive that reads and writes various kinds of information from and to a portable storage medium such as a CD-ROM drive, a DVD drive, or a flash memory.

The processing circuitry 131 includes, as hardware resources, a processor (unillustrated) and a memory such as a read-only memory (ROM) and a RAM, and collectively controls the MRI apparatus 1.

Such various functions of the processing circuitry 131 are stored in the storage apparatus 129 in the form of a program executable by a computer. The processing circuitry 131 is a processor which reads a program corresponding to these various respective functions from the storage apparatus 129 and executes the program to realize the function corresponding to the program. In other words, the processing circuitry 131 that has read each program is equipped with, for example, the functions shown in the processing circuitry 131 of FIG. 1.

FIG. 1 illustrates the case where the various functions are realized in a single piece of processing circuitry 131; however, the processing circuitry 131 may be configured by a combination of a plurality of independent processors, and the functions may be realized by the processors that execute the programs. In other words, each of the above-mentioned functions may be configured as a program, and a single piece of processing circuitry may execute each program, or a specific function may be implemented in exclusive, independent program-execution circuitry.

The term "processor" used in the above explanation means, for example, circuitry such as a central processing unit (CPU), a graphics processing unit (GPU), an application-specific integrated circuit (ASIC), or a programmable logic device (e.g., a simple programmable logic device (SPLD), a complex programmable logic device (CPLD), or a field-programmable gate array (FPGA).

The processor reads and executes a program stored in the storage apparatus 129 to realize the corresponding function. A program may be directly integrated into the circuitry of the processor, instead of storing the program on the storage apparatus 129. In this case, the processor reads and executes a program integrated into the circuitry to realize the corresponding function. Similarly, each of the couch control circuitry 109, the transmission circuitry 115, the reception circuitry 119, and the sequence control circuitry 121, etc. is also configured as an electronic circuit, such as the above processor.

The processing circuitry 131 controls the MRI apparatus 1 through the system control function 1311. Specifically, the processing circuitry 131 reads a system control program stored in the storage apparatus 129 and expands it in the memory, and controls each circuitry of the MRI apparatus 1 in accordance with the expanded system control program. For example, the processing circuitry 131 reads an examination protocol from the storage apparatus 129 through the system control function 1311 based on an imaging condition input by the operator via the interface 125. The processing circuitry 131 may generate the examination protocol based on the imaging condition. The processing circuitry 131 transmits the examination protocol to the sequence control circuitry 121 to control imaging of the subject P.

The processing circuitry 131 performs control through the system control function 1311 to apply an excitation pulse in accordance with the excitation pulse sequence and to apply a gradient magnetic field. The processing circuitry 131 causes the system control function 1311 to execute an excitation pulse sequence, and then collect an MR signal from the subject P in accordance with a data collection sequence, which is a pulse sequence for collecting various data, and thereby generates MR data. The system control function 1311 may be equipped with a function of performing a process similar to the sensor control unit 21.

The processing circuitry 131 fills MR data along a readout direction of k-space in accordance with an intensity of the readout gradient field through the image generation function 1313. The processing circuitry 131 generates an MR image by performing a Fourier transform on the MR data filled in the k-space. For example, the processing circuitry 131 can generate an absolute value (magnitude) image from complex MR data. Also, the processing circuitry 131 can generate a phase image using real-part data and imaginary-part data in the complex MR data. The processing circuitry 131 outputs an MR image such as an absolute value image and a phase image to the display 127, the storage apparatus 129, etc.

Next, details of the arrayed structure 20 will be described with reference to FIGS. 2 to 4.

Figure 3:
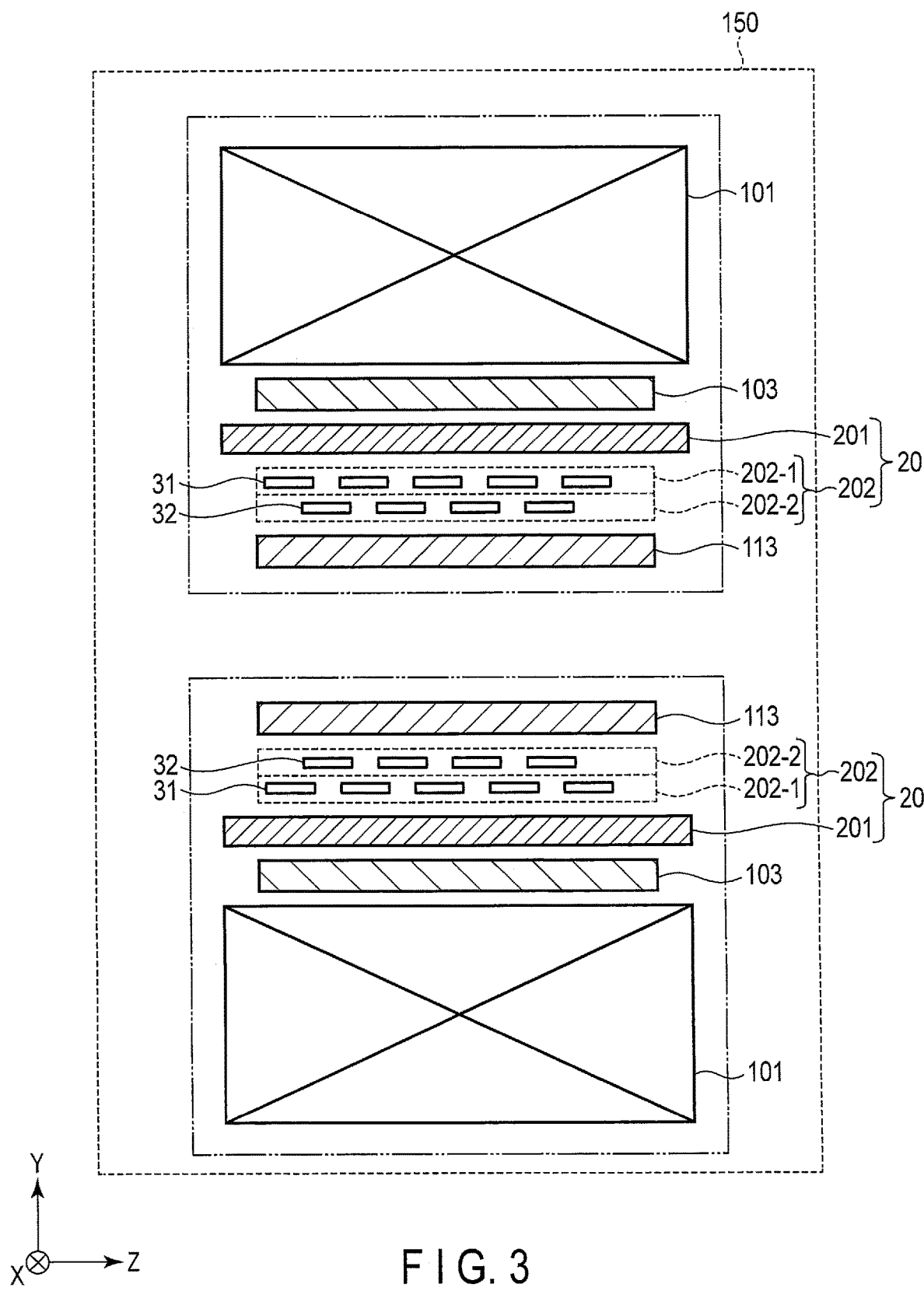
FIG. 3 is a cross-sectional view taken along a z-axis of a gantry of the MRI apparatus according to the embodiment.

FIG. 2 is a perspective view of the arrayed structure 20. FIG. 3 is a cross-sectional view of the gantry 150 of the MRI apparatus 1 taken along the z axis. FIG. 4 is a cross-sectional view of the gantry 150 of the MRI apparatus 1 taken along the x axis.

The arrayed structure 20 is arranged on an inner peripheral side of the gradient magnetic field coil 103 and on an outer peripheral side of the transmitter/receiver coil 113. The arrayed structure 20 includes a conductor layer 201 and a layer stack 202.

The conductor layer 201 is a cylindrical-shaped conductor arranged inside the gantry 150. The conductor layer 201 may be an RF shield that shields an RF signal stored in the gantry 150.

The layer stack 202 is a cylindrical-shaped structure arranged on an inner peripheral side of the conductor layer 201, and is a "metasurface" in which a plurality of frequency selective surfaces (FSSs), on each of which a plurality of elements are periodically arranged, are stacked. In each frequency selective surface that forms a metasurface, elements formed of metal conductors are periodically arranged on a flexible substrate formed in, for example, a cylindrical shape. By changing the shape and arrangement of the elements, it is possible to selectively change and control the frequency, amplitude, and phase of electromagnetic waves reflected from the conductor layer 201. That is, when the arrayed structure 20 is installed in the MRI apparatus 1, it is possible to control the phase when an MR signal emitted from the subject P is reflected by the conductor layer 201.

In the present embodiment, an example is shown in which two layers, namely, a first frequency selective surface (hereinafter referred to as "first layer 202-1") and a second frequency selective surface (hereinafter referred to as "second layer 202-2") arranged on an inner peripheral side of the first layer 202-1 are stacked; however, the configuration is not limited thereto, and two or more layers may be stacked. In addition, a material such as a dielectric material may be inserted between the substrates or the stacked layers.

In each of the first layer 202-1 and the second layer 202-2, periodically arranged elements behave as "patches". The elements 31 arranged in the first layer 202-1 and the elements 32 arranged in the second layer 202-2 are arranged so as to be staggered when the outer peripheral direction is viewed from the central axis of the cylinder, namely, as viewed toward the outer peripheral direction from the center of the concentric circle in FIG. 3 or 4. For example, the elements 31 and 32 are arranged in such a manner that part of the element 31 formed in the first layer and part of the element 32 formed in the second layer overlap. More specifically, the elements 31 and 32 are arranged in such a manner that, when the outer peripheral direction is viewed from the central axis of the cylinder, the center of each element 32 formed in the second layer overlaps a gap between the elements 31 periodically formed in the first layer.

Next, an example of a method of designing the elements of the layer stack 202 will be described with reference to the conceptual view of FIG. 5.

FIG. 5(a) shows a case where the first layer 202-1 and the second layer 202-2 that form the layer stack 202 are stacked in a plane. When an arrangement of the elements 51 is designed in a plane based on an applicable usage frequency of the arrayed structure 20 (hereinafter also referred to as "at the time of the planar design"), the size (area) and the interval of the periodic arrangement of the elements 51 are determined according to the applicable usage frequency. It is assumed that the elements 51 are shaped in a rectangle at the time of the planar design.

The applicable usage frequency is, for example, a resonant frequency of electromagnetic waves corresponding to the magnetic field intensity used in the MRI apparatus. Also, capacitance components and inductance components of the layer stack 202 at the time of the planar design are calculated. Specifically, a capacitance $C_V$ in a length direction and a capacitance $C_H$ in a circumferential direction of the layer stack 202, and an inductance $L_V$ in a length direction and an inductance $L_H$ in a circumferential direction of the layer stack 202 are calculated.

Figure 5:
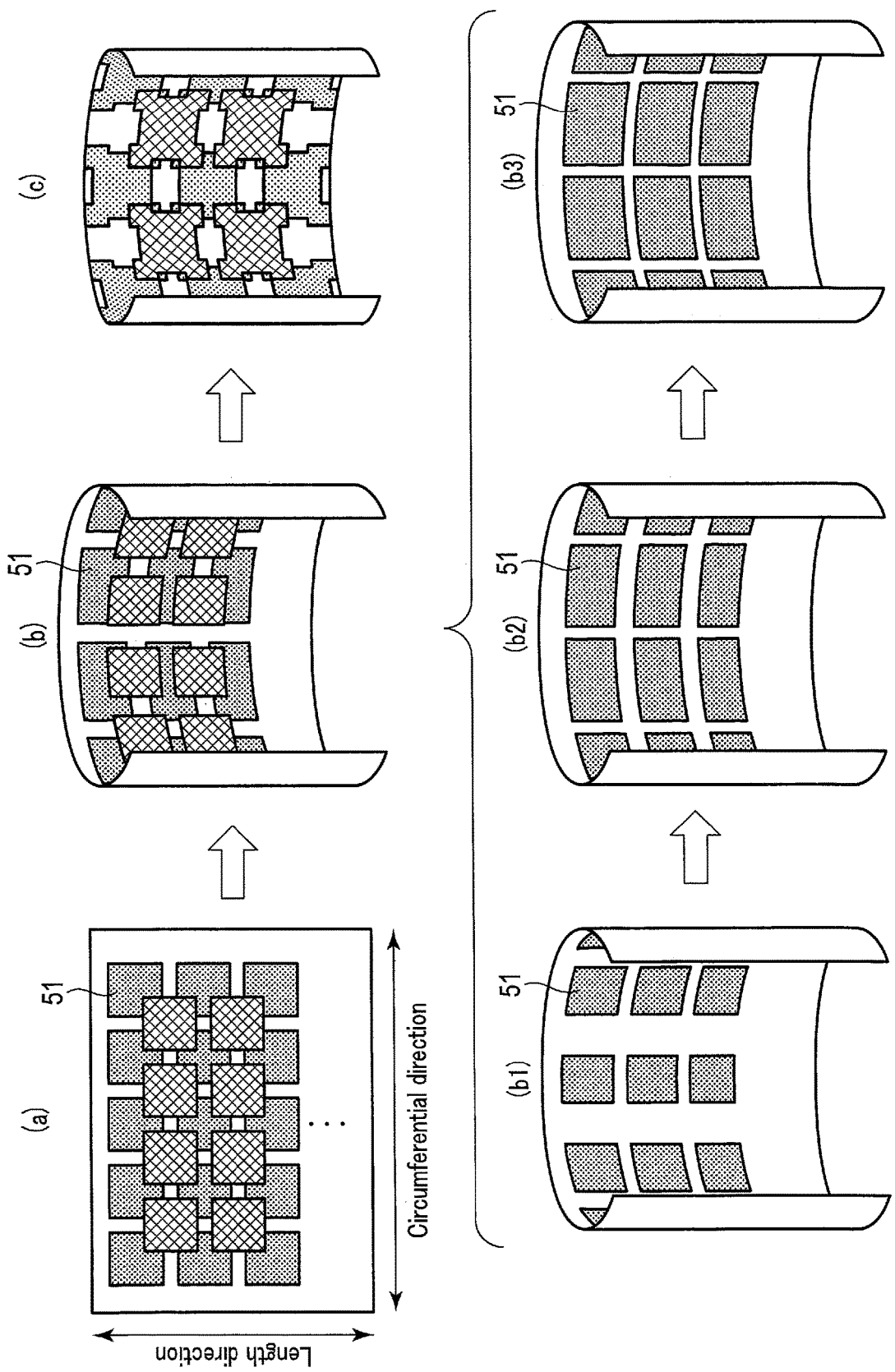
FIG. 5 is a conceptual view showing an example of a method of designing elements of a layer stack according to the embodiment.

Next, as shown in FIG. 5(b), it is assumed that the layer stack 202 is formed in a cylindrical shape with a desired curvature. The desired curvature is, for example, a curvature of a cylinder arranged in a space that is on an inner peripheral side of the gradient magnetic field coil 103 and on an outer peripheral side of the transmitter/receiver coil 113 in the gantry 150 of the MRI apparatus 1. When the planar-shaped layer stack 202 is formed into a cylindrical shape, the length of the circumference differs from layer to layer. Specifically, the interval of the elements does not change in the length direction of the layer stack 202 from that at the time of the planar design; however, the interval of the elements 51 is widened in the circumferential direction of the layer stack 202, since the layer on the outer peripheral side has a longer circumference, as shown in FIG. 5(b1). Accordingly, modifications as shown from FIG. 5(b1) to FIG. 5(b3) are assumed. A description from FIG. 5(b1) to FIG. 5(b3) will be given with reference to the first layer 202-1 as an example.

As an interval in the circumferential direction increases, the capacitance $C_H$ of a gap between the elements 51 in the circumferential direction decreases. If the size of the elements in the circumferential direction were increased to make the interval between the elements 51 in the circumferential direction revert to that at the time of the planar design, as shown in FIG. 5(b2), the inductance $L_H$ in the circumferential direction would increase, while the inductance $L_V$ in the length direction would decrease. Also, the capacitance. $C_V$ in the length direction would increase.

By increasing the size of the elements in the length direction while maintaining the size of the elements in the circumferential direction, as shown in FIG. 5(b3), it is possible to make adjustments in such a manner that the inductance $L_V$ in the length direction increases and the inductance $L_H$ in the circumferential direction decreases. Thereby, it is possible to make the values of the inductance $L_V$ and the inductance $L_H$ revert to those at the time of the planar design. However, the increase in the lengths of the sides and the decrease in the interval between the elements cause an increase in the capacitance components ($C_V$ and $C_H$).

Thus, when the layer stack 202 is ultimately designed in a cylindrical shape, offsets are provided in each element 51, as shown in FIG. 5(c), and the area and the shape of each element of the first layer 202-1 and the second layer 202-2 are adjusted based on the curvature. Thereby, even when the layer stack 202 is formed in a cylindrical shape, the inductance components and the capacitance components can be designed to be approximately the same values as those at the time of the planar design.

More specifically, a first example element shape will be described with reference to FIG. 6.

Figure 6:
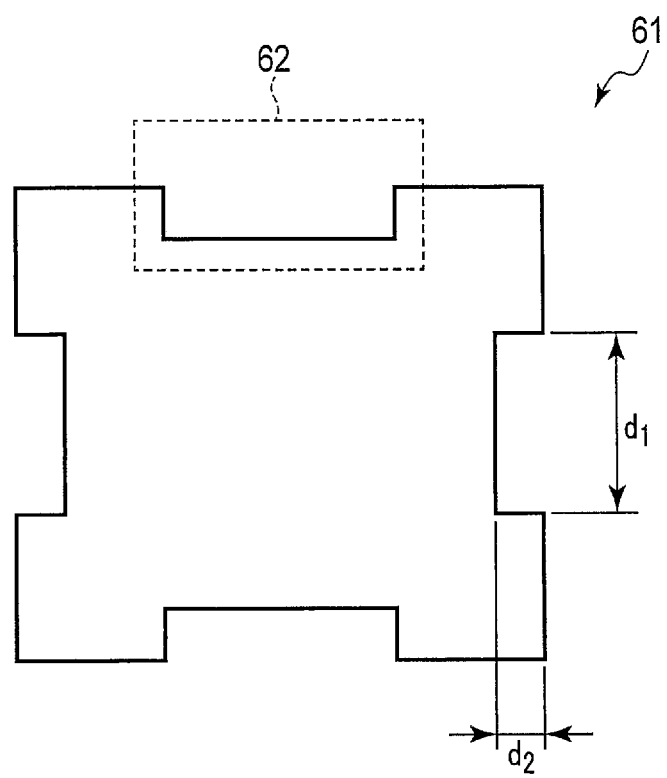
FIG. 6 is a diagram showing a first example element shape according to the embodiment.

FIG. 6 shows a single element 61 according to the first example. The element 61 is a patch obtained by forming a conductor in a planar shape, and is shaped in such a manner that at least a portion of each edge that faces another element 61 adjacent thereto in the layer is closer to the center of the element than the other portion of the edge. In other words, the center of the element is the central point of the element 61, and the element 61 is formed in such a manner that, when viewed from the top, at least a midpoint portion of each side is formed in a concave shape intended toward the central point of the element 61. In other words, the element 61 is shaped in a rectangle (quadrilateral) including an offset portion 62 at a central portion of each side. By adjusting a size $d_1$ of the offset portion 62 of the element 61, namely, a size $d_1$ of a notch portion in a length direction and a depth $d_2$ of the offset portion 62 toward the center of the element, it is possible to adjust the capacitance components ($C_V$ and $C_H$). Thereby, even when the layer stack 202 is formed in a cylindrical shape, the capacitance components can be designed to be substantially the same values as those of the capacitance components at the time of the planar design.

Next, the layer stack 202 having a first example element shape will be described with reference to FIG. 7.

FIG. 7 shows a portion of the layer stack 202, with the lateral direction representing a circumferential direction and the vertical direction representing a length direction (z-axis direction) that is orthogonal to the circumferential direction.

The left part of FIG. 7 shows an element arrangement of a first layer 202-1. The elements 61 of the first layer 202-1 have the shape shown in FIG. 6, and are periodically arranged with a predetermined gap interposed therebetween. An offset portion 62 (notch portion) is formed at a central portion of each side of the element 61.

The central part of FIG. 7 shows an element arrangement of the first layer 202-2. The elements 71 of the second layer 202-2 are formed in a similar manner to the elements of the first layer 202-1.

The right part of FIG. 7 shows a state of the layer stack 202 in which the first layer 202-1 and the second layer 202-2 are stacked in a cylindrical shape. Thus, when the first layer 202-1 and the second layer 202-2 are viewed from a stacking direction in which they are stacked, namely, when viewed from an outer peripheral direction with respect to a central axis of a cylinder when they are cylindrically shaped, the elements 71 of the second layer 202-2 are arranged in such a manner that the center of each element 71 is positioned at a gap between the elements 61 of the first layer 202-1. More specifically, the elements 71 of the second layer 202-2 are arranged in such a manner that the center of each element 71 is positioned at a gap formed so as to be surrounded by four of the elements 61 of the first layer 202-1. The element arrangement in each layer is not limited to the positional relationship shown in the right part of FIG. 7, and any arrangement may be adopted as long as the positional relationship is capable of appropriately controlling the phase of the usage frequency.

In the step of designing the layer stack 202 shown in the right side of FIG. 7, analytical design can be performed through simulation based on, for example, design values of the capacitance components and the inductance components in the plane. In this manner, even when the layer stack 202 is formed in a cylindrical shape, inductance components and capacitance components can be designed to be similar to those at the time of the planar design, and phase characteristics that are desirable for the electromagnetic waves can be obtained. That is, a reflection signal obtained by letting an MR signal reflect off the conductive layer can be adjusted to be at the same phase as the MR signal directly received by the transmitter/receiver coil 113, thus improving the reception gain of the MR signal received by the transmitter/receiver coil 113. Since adjustment of the phase characteristics produces similar effects at the time of transmission of an RF signal, it is also possible to increase the signal intensity of an RF signal when the RF signal is transmitted from the transmitter/receiver coil 113.

In FIG. 5, the order of designing the elements has been described from the point of view of convenience of explanation of changes in the inductance components and the capacitance components caused by a change in element shape; however, the order is not limited thereto. For example, the planar design may be omitted, and the elements in the shape shown in FIG. 6 may be periodically arranged in a cylindrical-shaped layer stack 202, while analytically adjusting, through a simulation, the interval between the elements in the circumferential direction and the length direction and a size $d_1$ and a depth $d_2$ of offsets of the elements.

Next, a second example element shape will be described with reference to FIG. 8.

Figure 8:
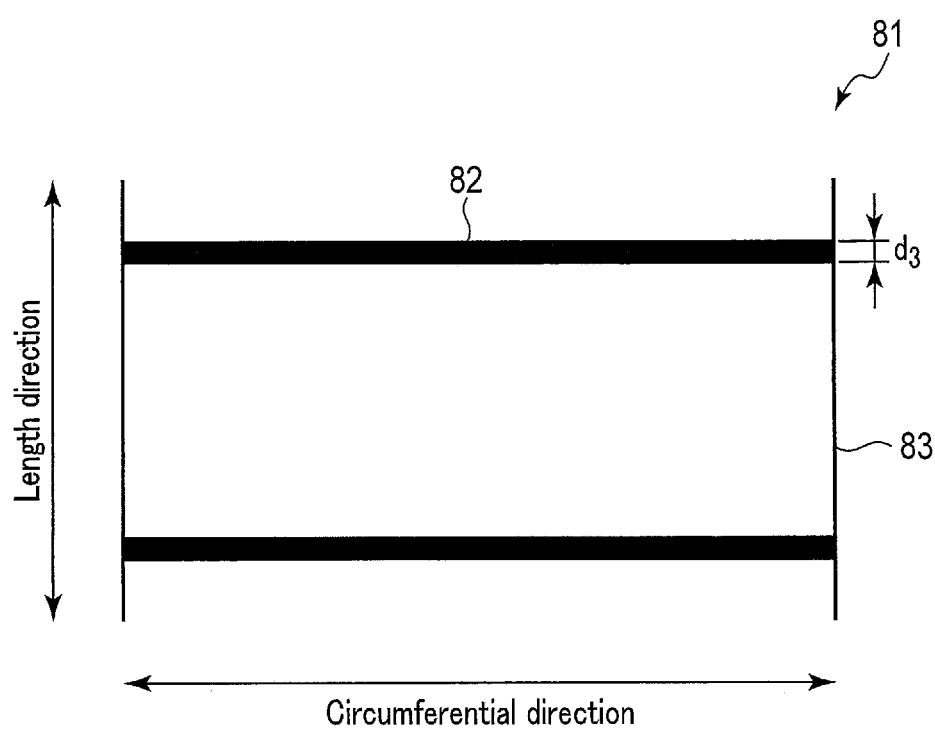
FIG. 8 is a diagram showing a second example element shape according to the embodiment.

FIG. 8 shows a single element 81 according to the second example. The element 81 is formed of a ring-shaped conductor, with sides 82 (longer sides of the rectangle) that are parallel to the circumferential direction having a width (thickness) greater than a width of sides 83 (shorter sides of the rectangle in this case) that are parallel to the length direction (z-axis direction) of the layer stack 202. In the example of FIG. 8, it is assumed that the ring-shaped conductor is a rectangle (quadrilateral).

Sides 82 that are parallel to the circumferential direction are offset toward the center of the element. Thereby, the capacitance component $C_V$ in the length direction can be decreased. At this time, even when the side 82 is offset, the inductance components ($L_V$ and $L_H$) and the capacitance $C_H$ in the circumferential direction do not change. By adjusting a width $d_3$ of the side 82, it is possible to adjust only the inductance $L_H$ in the circumferential direction. As a result, the inductance components and the capacitance components can be easily adjusted.

Next, a layer stack 202 having the second example element shape will be described with reference to FIG. 9.

Figure 9:
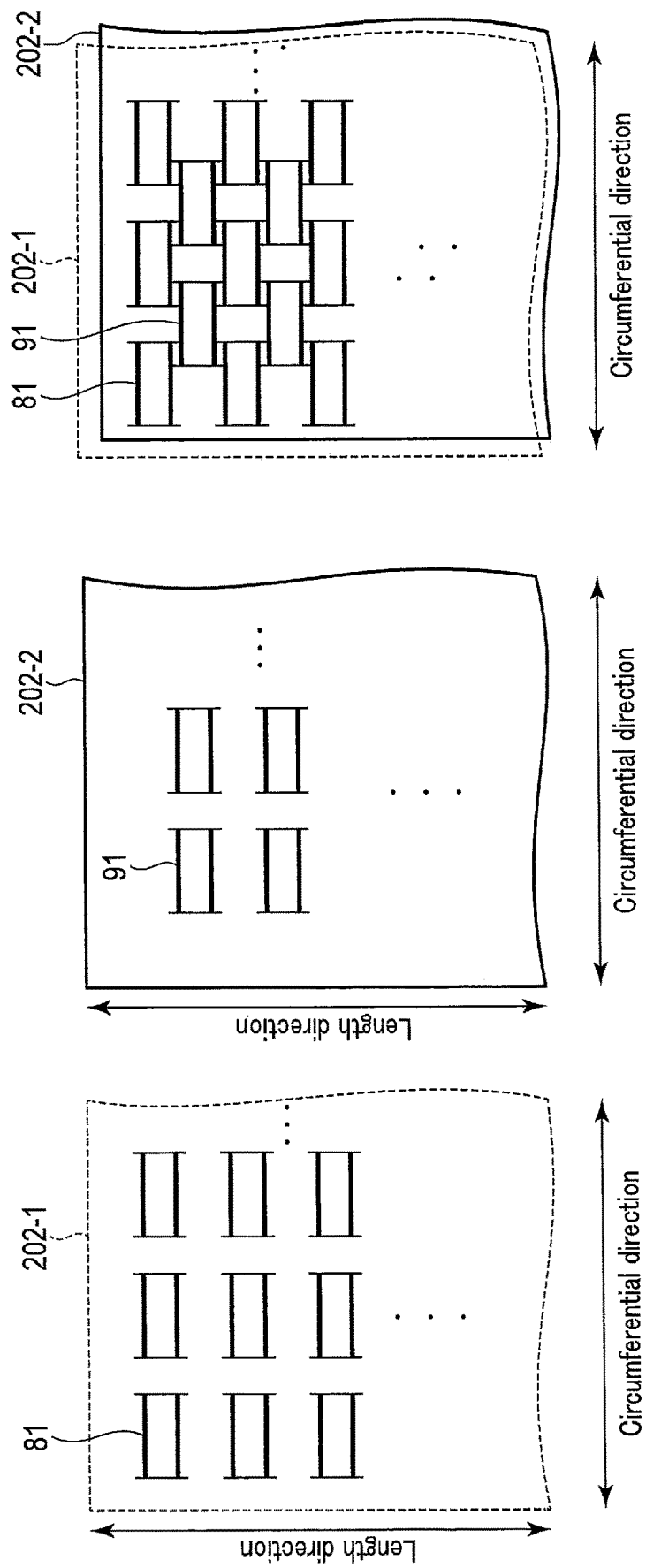
FIG. 9 is a diagram showing a layer stack having the second example element shape according to the embodiment.

Similarly to FIG. 7, FIG. 9 shows a portion of the layer stack 202, with the lateral direction representing a circumferential direction and the vertical direction representing a length direction (z-axis direction) that is orthogonal to the circumferential direction.

The left part of FIG. 9 shows an arrangement of elements 81 of the first layer 202-1, and the central part of FIG. 9 shows an arrangement of the elements 91 of the second layer 202-2. The arrangement of the elements is similar to the arrangements shown in the left part and the central part of FIG. 7, except that the shape of the elements differs.

Similarly to the right part of FIG. 7, the right part of FIG. 9 shows a state of the layer stack 202 in which the first layer 202-1 and the second layer 202-2 are stacked in a cylindrical shape. In the case of the second example element shape, too, when the first layer 202-1 and the second layer 202-2 are viewed from a stacking direction in which they are stacked, namely, when viewed from an outer peripheral direction from a central axis of a cylinder when they are cylindrically shaped, the elements 91 of the second layer 202-2 are arranged in such a manner that the center of each element 91 is positioned at a gap between the elements 81 of the first layer 202-1.

The layer stack 202 may be in a shape obtained by combining the element shapes of FIGS. 7 and 9. An example of the layer stack 202 obtained by combining the first and second example element shapes will be described with reference to FIG. 10.

FIG. 10 shows a case where the first layer 202-1 has an element structure according to the first example shown in FIG. 6, and the second layer 202-2 has an element structure according to the second example shown in FIG. 8. In contrast, the first layer 202-1 may have an element structure according to the second example shown in FIG. 8, and the second layer may have an element structure according to the first example shown in FIG. 6.

By designing in advance an arrangement of elements in a state in which layers with different element structures are stacked at the time of design of frequency selective surfaces with respect to the usage frequency, the layer stack 202 with different element structures as shown in FIG. 10 may be realized.

The shape of the elements is not limited to the above-described ones, and any shape and periodic arrangement may be adopted as long as the values of the inductance component and the reactance component become substantially the same as those at the time of planar design when the layer stack 202 is formed in a cylindrical shape.

(Modification)

Both the element 61 in the first example element shape and the element 81 in the second example element shape described above are assumed to be based on a rectangle (quadrilateral); however, the configuration is not limited thereto, and the element shape may be based on other polygons such as a hexagon and an octagon or may be based on a round shape such as a precise circle or an oval, or may be based on a complex shape in which part of the element includes a circular arc.

Figure 11:
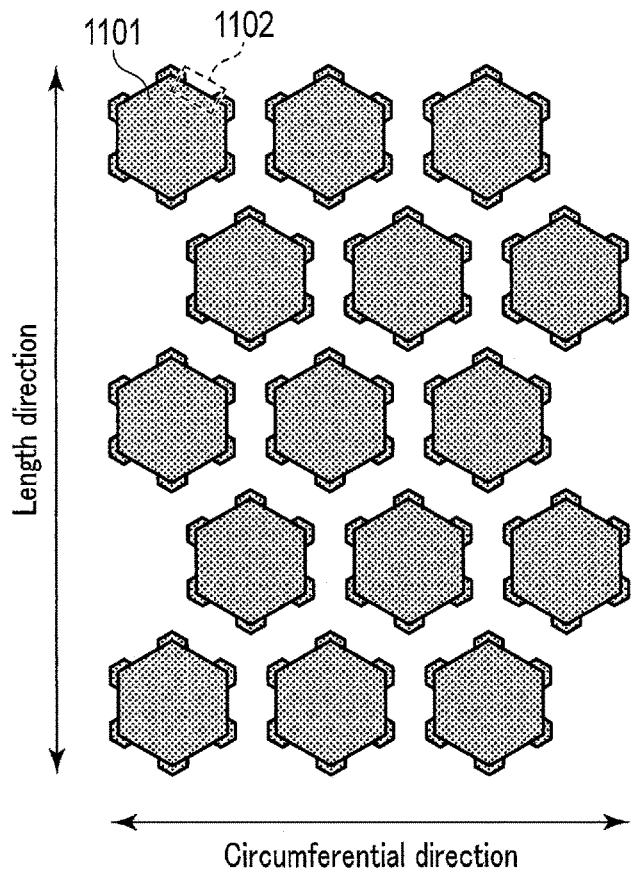
FIG. 11 is a diagram showing a first example element arrangement according to a modification.

A first example element arrangement according to the modification is shown in FIG. 11. In the modification shown in FIG. 11 and the drawings that follow, the first layer 202-1 and the second layer 202-2 are not distinguished from each other for convenience in explanation; however, when they are stacked, they can be arranged in such a manner that the center of the element of the second layer 202-2 is positioned at a gap between elements of the first layer 202-1 when viewed from the outer circumferential direction from the central axis of the cylinder when a cylindrical shape is adopted, similarly to the above-described embodiment.

FIG. 11 shows an example in which elements 1101 formed of hexagon-based conductors are arranged. Each element 1101 has a shape that includes an offset portion 1102 at a central part of each side that faces another element 1101 adjacent thereto in the layer. The element 1101 may be formed by offsetting the central part of each side of the hexagon-shaped conductor, or may be formed in such a manner that the central part becomes relatively offset by providing a projecting portion at each vertex of the hexagon-shaped conductor.

By adjusting the size of the vertex portion (or the projecting portion if the projecting portion is provided) and the size of the offset portion 1102, it is possible to adjust the capacitance component and the inductance component. Herein, the offset portion 1102, namely, the notch portion, is trapezoidal; however, the shape of the offset portion is not limited thereto, and may be a rectangular notch portion as shown in FIG. 6.

Figure 12:
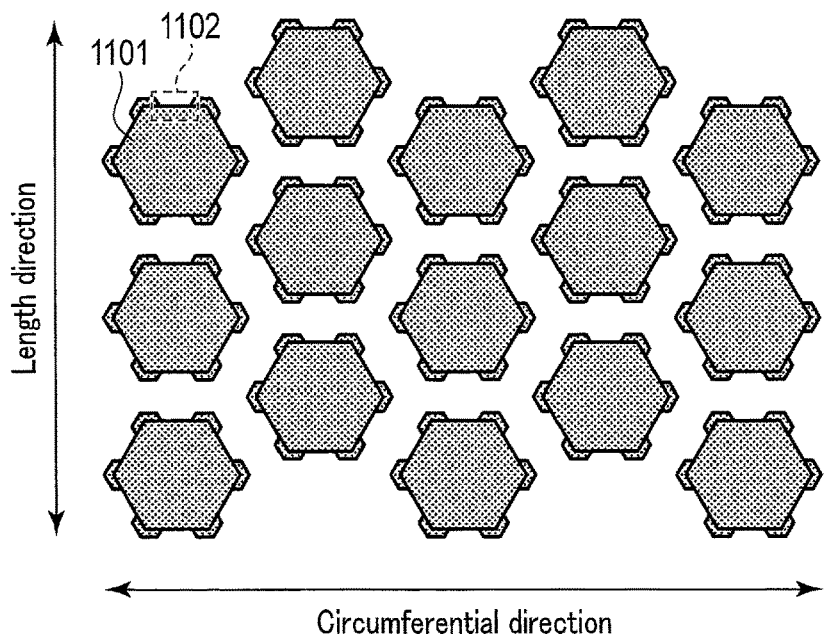
FIG. 12 is a diagram showing a second example element arrangement according to the modification.

Next, a second example element arrangement according to the modification is shown in FIG. 12.

In the first example element arrangement shown in FIG. 11, a case is shown where the elements 1101 are arranged in such a manner that their side portions (offset portions 1102) become parallel to the length direction, whereas in the second example element arrangement shown in FIG. 12, the elements 1101 are arranged in such a manner that their side portions become parallel to the circumferential direction.

Figure 13:
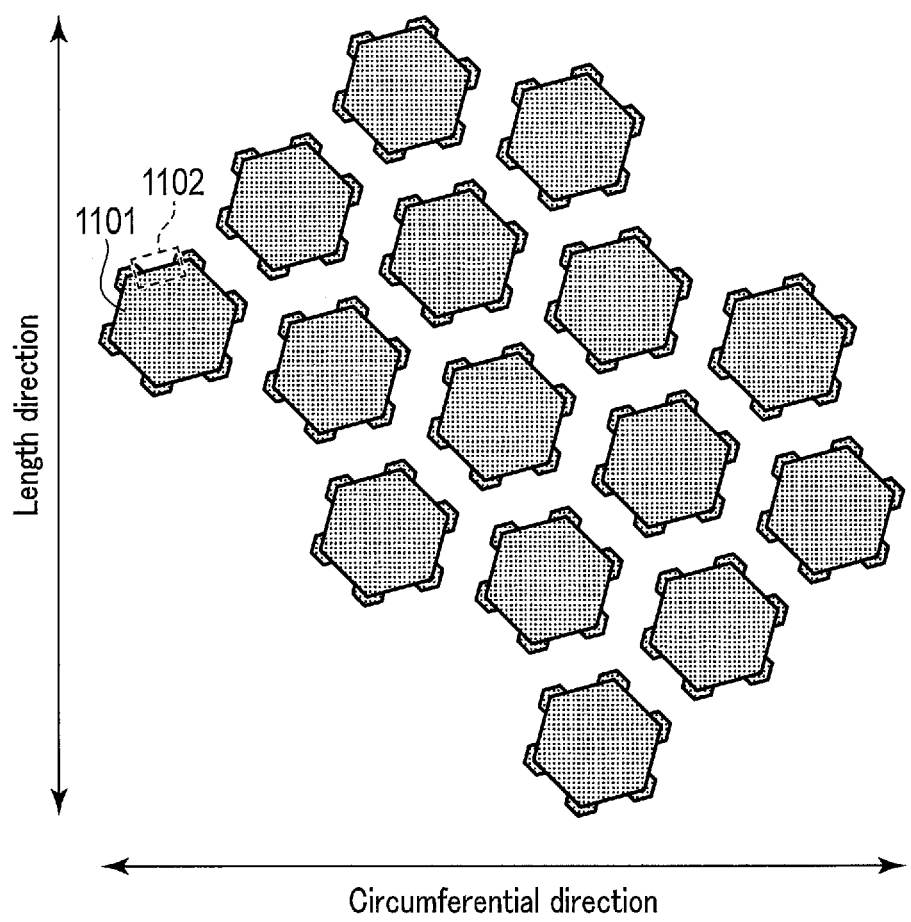
FIG. 13 is a diagram showing a third example element arrangement according to the modification.

A third example element arrangement according to the modification is shown in FIG. 13. FIG. 13 shows an arrangement in which the elements 1101 are arrayed in a diagonal orientation.

As shown in FIGS. 12 and 13, the elements 1101 may be arrayed in any orientation.

Figure 14:
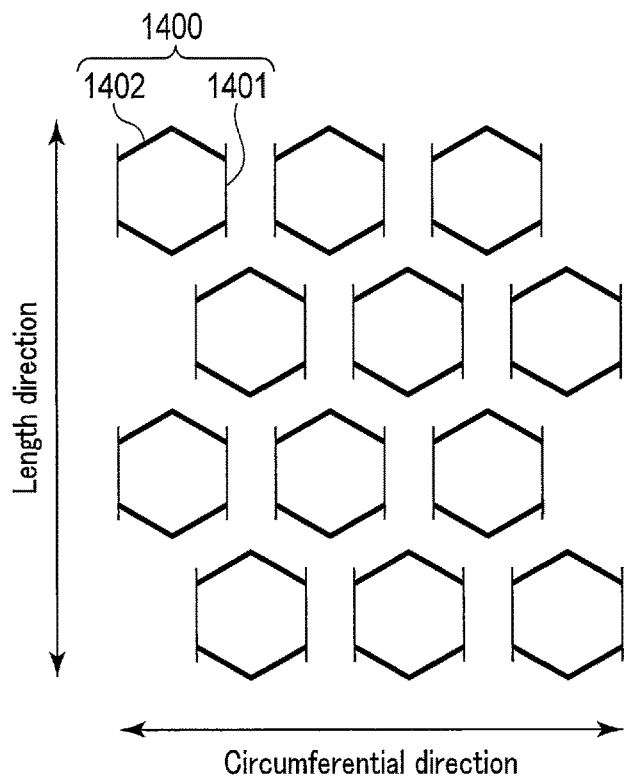
FIG. 14 is a diagram showing a fourth example element arrangement according to the modification.

Next, a fourth example element arrangement according to the modification is shown in FIG. 14.

FIG. 14 shows a first modification of ring-shaped conductors according to the second example element shape, showing a case where each element 1400 of a plurality of ring-shaped conductors is a conductor formed in the shape of a hexagonal ring. The elements 1400 are arranged in such a manner that their sides 1401 become parallel to the length direction. The elements 1400 are formed in such a manner that sides 1402 of the element 1400 that face another element 1400 adjacent thereto in the length direction and that extend in an approximately circumferential direction have a greater width than sides 1401 that are parallel to the length direction. Herein, wedge-shaped sides each formed of two continuous sides are formed to have a large thickness.

Also, sides 1402 that extend in the approximately circumferential direction are offset toward the center of the element. By adjusting the size (depth) of the offset portion, it is possible to adjust the capacitance components of a gap between the elements 1400 that are adjacent to each other in the length direction. Moreover, by adjusting the line width, the inductance components in the circumferential direction can be adjusted. Furthermore, by adjusting the length of sides 1401 that are parallel to the length direction, the capacitance components in the circumferential direction can be adjusted.

Figure 15:
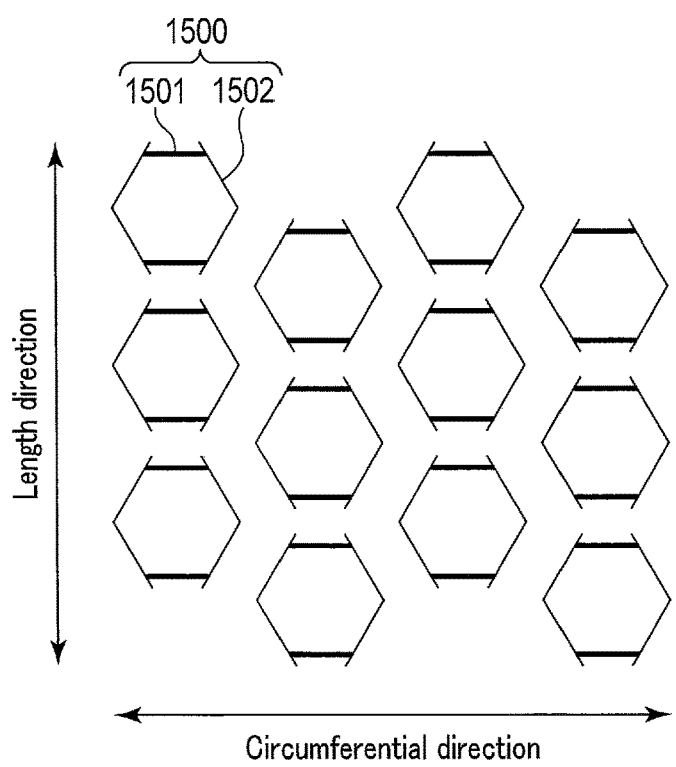
FIG. 15 is a diagram showing a fifth example element arrangement according to the modification.

Next, a fifth example element arrangement according to the modification is shown in FIG. 15.

FIG. 15 shows a second modification of a ring-shaped conductor according to the second example element shape. In this example, the elements 1500 are arranged in such a manner that the sides 1501 become parallel to the circumferential direction.

Sides 1501 of the element 1500 that face another element 1500 and that extend in parallel to the circumferential direction have a greater width than sides 1502 that are approximately parallel to the length direction. Also, sides 1501 that extend in parallel to the circumferential direction are offset toward the center of the element. By adjusting the size (depth) of the offset portion, it is possible to adjust the capacitance components of a gap between the elements 1500 that are adjacent to each other in the length direction. Moreover, by adjusting the line width of sides 1501, the inductance components in the circumferential direction can be adjusted. Furthermore, by adjusting the lengths of two sides 1502 that are approximately parallel to the length direction, the capacitance components in the circumferential direction can be adjusted.

The elements 1400 and the elements 1500, too, may be arrayed in a diagonal orientation.

Figure 16:
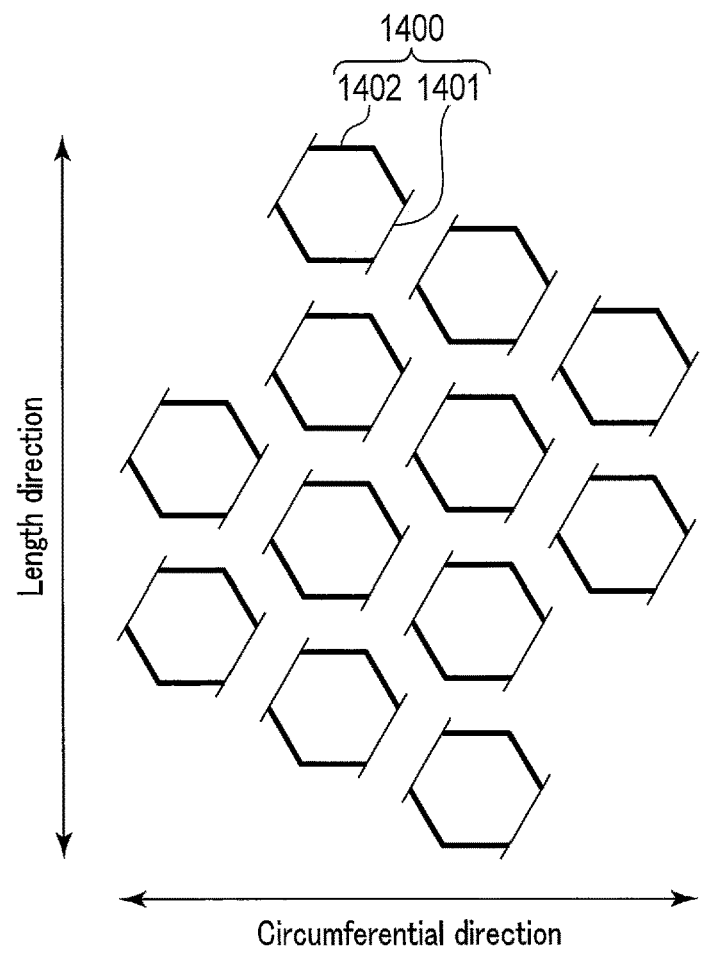
FIG. 16 is a diagram showing an example of a case where elements 1400 are diagonally arrayed.
Figure 17:
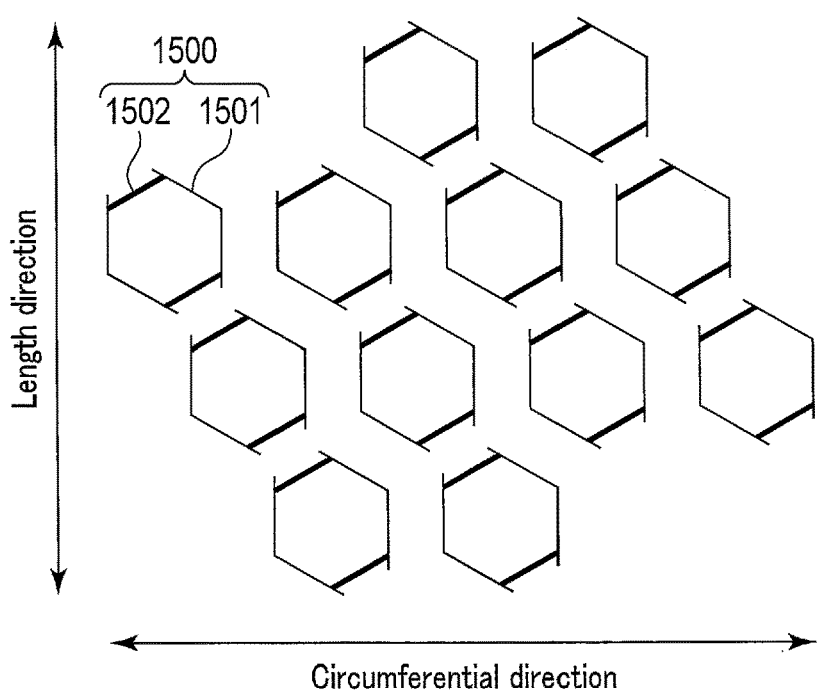
FIG. 17 is a diagram showing an example of a case where elements 1500 are diagonally arrayed.

FIG. 16 shows a case where the elements 1400 are diagonally arrayed, and FIG. 17 shows a case where the elements 1500 are diagonally arrayed. In this manner, the elements 1400 and the elements 1500 may be arranged in such a manner that they are tilted at a predetermined angle.

According to the above-described embodiment, a cylindrical-shaped arrayed structure which includes a conductor layer that is an RF shield and a structure in which a plurality of frequency selective surfaces designed for the usage frequency are stacked is formed, and elements of each frequency selective surface are formed in such a manner that at least a portion of each edge that faces an adjacent element in the layer is closer to the center of the element. It is thereby possible to adjust the phase characteristics of the usage frequency. In particular, by arranging an arrayed structure on an outer peripheral side of a transmitter/receiver coil (whole body coil) in an MRI apparatus, a reflection signal obtained by letting an MR signal reflect off the conductive layer can be adjusted to be at the same phase as the MR signal directly received by the transmitter/receiver coil, and the reception gain of the MR signal received by the transmitter/receiver coil can be improved. This contributes to a workflow that enables examination without the need to mount a receiver coil on the subject P.

According to at least one of the above-described embodiments, it is possible to improve the reception gain.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Regarding the foregoing embodiments, the appendage of the following is disclosed as one aspect and selective features of the invention.

(Additional Note 1)

A periodic structure includes: a cylindrical-shaped conductor layer; and a cylindrical-shaped layer stack which is arranged on an inner periphery of the conductor layer and in which a plurality of frequency selective surfaces are stacked, each of the frequency selective surfaces having a plurality of elements which are periodically arranged, and each element of the plurality of elements is formed in such a manner that at least a portion of an edge of a first element that faces an adjacent element in the same layers is closer to a center of the first element than another portion of the edge.

(Additional Note 2)

The element may be a conductor formed in a planar shape, and may be formed in such a manner that at least a portion of the edge is offset toward the center of the element.

(Additional Note 3)

The element may be a polygonal conductor, and may be formed in such a manner that a part of each side is offset toward a center of the element.

(Additional Note 4)

The element may be a ring-shaped conductor, and may be formed in such a manner that an edge that is parallel to a circumferential direction is offset toward a center of the element, and a width of the edge is greater than a width of a side that is orthogonal to the circumferential direction.

(Additional Note 5)

The ring-shaped conductor may be a polygon.

(Additional Note 6)

The polygon may be a quadrilateral or a hexagon.

(Additional Note 7)

The center of the element may be a central point of the element, and at least a midpoint portion of each edge may be formed in a concave shape intended toward the central point.

(Additional Note 8)

The elements may be arranged in such a manner that an inductance component and a capacitance component based on a planar arrangement of a layer stack that has been designed based on a usage frequency take values that are substantially identical to values of an inductance component and a capacitance component when the layer stack is formed in a cylindrical shape.

(Additional Note 9)

The elements may be arranged in such a manner that, by adjusting an area based on a curvature of a cylinder formed of the layer stack, the inductance component and the capacitance component take values that are substantially identical to values of the inductance component and the capacitance component of the layer stack based on the planar arrangement.

(Additional Note 10)

The elements may be arranged in such a manner that, when an outer circumferential direction is viewed from a central axis of a cylinder formed of the layer stack, a part of an element formed in a first layer of the layer stack and a part of an element formed in a second layer of the layer stack overlap.

(Additional Note 11)

The elements may be arranged in such a manner that, when an outer peripheral direction is viewed from a central axis of a cylinder formed of the layer stack, a center of an element formed in a second layer is positioned at a gap between elements formed in the first layer of the layer stack, the second layer being arranged on an inner peripheral side of the first layer.

(Additional Note 12)

An element formed in a first layer of the layer stack may be formed as a quadrilateral conductor, with a part of each side being offset toward a center of the element.

An element formed in a second layer of the layer stack is a rectangular, ring-shaped conductor, with a side parallel to a circumferential direction being offset toward the center of the element, a thickness of the side being greater than a thickness of a side that is orthogonal to the circumferential direction.

(Additional Note 13)

A magnetic resonance imaging apparatus includes: a gradient magnetic field coil; an arrayed structure according to any one of Additional Notes 1 to 12, arranged on an inner periphery of the gradient magnetic field coil; and a transmitter/receiver coil arranged on an inner periphery of the arrayed structure and configured to transmit and receive an RF signal.

(Additional Note 14)

The element may be a quadrilateral conductor, with a notch being formed at a part of each side.

(Additional Note 15)

The elements may be arranged in such a manner that, when an outer peripheral direction is viewed from a central axis of a cylinder formed of the layer stack, a center of an element formed in a second layer that is arranged on an inner peripheral side of the first layer overlaps a gap formed by four elements included in a plurality of elements formed in a first layer of the layer stack.

The invention claimed is:

1. An arrayed structure, comprising:
a cylindrical-shaped conductor layer; and
a cylindrical-shaped layer stack arranged on an inner periphery of the conductor layer and in which a plurality of frequency selective surfaces are arranged in layers and stacked, each of the frequency selective surfaces having a plurality of elements that are periodically arranged, wherein
each element of the plurality of elements is formed in such a manner that at least a portion of an edge of a particular element that faces an adjacent element in a same layer is closer to a center of the particular element than another portion of the edge,
the center of each element is a central point of the element, and
the edge is a straight line or an arc connecting two vertices of the element, and the edge is formed in such a manner that a central portion is concave toward the central point and a portion other than the central portion maintains the straight line or the arc.

2. The arrayed structure according to claim 1, wherein each element is a conductor formed in a planar shape, and is formed in such a manner that at least the portion of the edge is offset toward the center of the element.

3. The arrayed structure according to claim 1, wherein each element is a polygonal conductor, and is formed in such a manner that a portion of each side is offset toward the center of the element.

4. The arrayed structure according to claim 1, wherein each element is a ring-shaped conductor, and is formed in such a manner that an edge that is parallel to a circumferential direction is offset toward the center of the element, and a width of the edge is greater than a width of a side that is orthogonal to the circumferential direction.

5. The arrayed structure according to claim 4, wherein the ring-shaped conductor is a polygon.

6. The arrayed structure according to claim 3, wherein the polygon is a quadrilateral or a hexagon.

7. The arrayed structure according to claim 5, wherein the polygon is a quadrilateral or a hexagon.

8. The arrayed structure according to claim 1, wherein the elements are arranged in such a manner that an inductance component and a capacitance component of the layer stack based on a planar arrangement of a layer stack that has been designed based on a usage frequency take values that are substantially identical to values of an inductance component and a capacitance component when the layer stack is formed in a cylindrical shape.

9. The arrayed structure according to claim 8, wherein the elements are arranged in such a manner that, by adjusting an area based on a curvature of a cylinder formed of the layer stack, the inductance component and the capacitance component take values that are substantially identical to values of the inductance component and the capacitance component based on the planar arrangement.

10. The arrayed structure according to claim 1, wherein the elements are arranged in such a manner that, when an outer circumferential direction is viewed from a central axis of a cylinder formed of the layer stack, a part of an element formed in a first layer of the layer stack and a part of an element formed in a second layer of the layer stack overlap.

11. The arrayed structure according to claim 1, wherein the elements are arranged in such a manner that, when an outer peripheral direction is viewed from a central axis of a cylinder formed of the layer stack, the center of the element formed in a second layer is positioned at a gap between elements formed in the first layer of the layer stack, the second layer being arranged on an inner peripheral side of the first layer.

12. The arrayed structure according to claim 1, wherein
a first element formed in a first layer of the layer stack is a quadrilateral conductor, with a part of each side being offset toward a center of the first element, and
a second element formed in a second layer of the layer stack is a rectangular, ring-shaped conductor, with a side parallel to a circumferential direction being offset toward a center of the second element, a thickness of the side being greater than a thickness of a side that is orthogonal to the circumferential direction.

13. A magnetic resonance imaging apparatus, comprising:
a gradient magnetic field coil;
the arrayed structure according to claim 1, arranged on an inner periphery of the gradient magnetic field coil; and
a transmitter/receiver coil arranged on an inner periphery of the arrayed structure and configured to transmit and receive an RF signal.

14. The arrayed structure according to claim 1, wherein edges that face each other of adjacent elements are parallel.

15. The arrayed structure according to claim 1, wherein a first element formed in a first layer of the layer stack is a quadrilateral conductor, with a part of each side being offset toward a center of the first element.

16. The arrayed structure according to claim 1, wherein each edge includes, in addition to the central portion, first and second edge portions on either side of the central portion, wherein the first and second edge portions extend in a same direction.

17. An arrayed structure, comprising:
a cylindrical-shaped conductor layer; and
a cylindrical-shaped layer stack arranged on an inner periphery of the conductor layer and in which a plurality of frequency selective surfaces are arranged in layers and stacked, each of the frequency selective surfaces having a plurality of elements that are periodically arranged, wherein each element of the plurality of elements is formed in such a manner that at least a portion of an edge of a particular element that faces an adjacent element in a same layer is closer to a center of the particular element than another portion of the edge, and the elements are arranged in such a manner that, when an outer circumferential direction is viewed from a central axis of a cylinder formed of the layer stack, a part of an element formed in a first layer of the layer stack and a part of an element formed in a second layer of the layer stack overlap.

18. An arrayed structure, comprising:
a cylindrical-shaped conductor layer; and
a cylindrical-shaped layer stack arranged on an inner periphery of the conductor layer and in which a plurality of frequency selective surfaces are arranged in layers and stacked, each of the frequency selective surfaces having a plurality of elements that are periodically arranged, wherein each element of the plurality of elements is formed in such a manner that at least a portion of an edge of a particular element that faces an adjacent element in a same layer is closer to a center of the particular element than another portion of the edge, and each element is a ring-shaped conductor, and is formed in such a manner that an edge that is parallel to a circumferential direction is offset toward the center of the element, and a width of the edge is greater than a width of a side that is orthogonal to the circumferential direction.

* * * * *